(12) United States Patent
Sharon et al.

(10) Patent No.: US 12,500,609 B2
(45) Date of Patent: Dec. 16, 2025

(54) OPTIMIZED DECODING SCHEDULING IN A JOINT LDPC AND RAID DECODING SCHEME

(71) Applicant: Sandisk Technologies, Inc., Milpitas, CA (US)

(72) Inventors: Eran Sharon, Rishon Lezion (IL); Alexander Bazarsky, Holon (IL)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/671,810

(22) Filed: May 22, 2024

(65) Prior Publication Data

US 2025/0365022 A1    Nov. 27, 2025

(51) Int. Cl.
*H03M 13/00* (2006.01)
*H03M 13/11* (2006.01)
*H03M 13/29* (2006.01)

(52) U.S. Cl.
CPC .... *H03M 13/2927* (2013.01); *H03M 13/1111* (2013.01); *H03M 13/611* (2013.01)

(58) Field of Classification Search
CPC ............ H03M 13/1111; H03M 13/611; H03M 13/2909; H03M 13/2927
See application file for complete search history.

(56) References Cited

U.S. PATENT DOCUMENTS

| | | | | |
|---|---|---|---|---|
| 8,910,013 | B1 * | 12/2014 | Yang | H03M 13/2927 714/755 |
| 10,636,495 | B2 * | 4/2020 | Chen | G11C 16/08 |
| 10,637,511 | B2 * | 4/2020 | Tao | G06F 11/1012 |
| 10,673,465 | B2 * | 6/2020 | Watanabe | H03M 13/39 |
| 10,789,127 | B2 * | 9/2020 | Yu | G06F 11/1076 |
| 2013/0311858 | A1 | 11/2013 | Ramesh et al. | |
| 2024/0097708 | A1 | 3/2024 | Benisty et al. | |

FOREIGN PATENT DOCUMENTS

JP    2009089312 A    4/2009

OTHER PUBLICATIONS

Lee, K., et al., "ECC-Aided RAID for Reliability Improvement of SSD", IEEE Xplore, pp. 3772-3778, (2020).
Stella, A., et al., "Employing ECCs via Overprovisioning to Improve Flash Reliability: A New, Cost-Efficient Approach", Flash Memory Summit, pp. 2-30 (Aug. 2016).
Eran, S., et al., "Leveraging RAID for Soft BCH Decoding", NVMW, pp. 2-12 (Mar. 2017).

* cited by examiner

*Primary Examiner* — Esaw T Abraham
(74) *Attorney, Agent, or Firm* — DENTONS Durham Jones Pinegar

(57) ABSTRACT

A data storage device includes an error correction code (ECC) ordering system that determines a decoding schedule in which two or more flash memory units (FMUs) that have failed an initial decoding process are to be decoded using a joint decoding scheme. The ECC ordering system generates the decoding schedule based on a metric associated with each FMU. The metric on which the decoding schedule is based is a syndrome weight associated with each FMU or is a combined bit error rate (BER) associated with each FMU. When the decoding schedule has been generated, the ECC ordering system causes a joint decoding operation to be executed on the FMUs in the order specified by the decoding schedule.

20 Claims, 9 Drawing Sheets

OPTIMIZED DECODING SCHEDULING IN A JOINT LDPC AND RAID DECODING SCHEME

BACKGROUND

Data storage devices typically include error correction capabilities to correct errors that occur when data is read from the data storage device. For example, when data is written to the data storage device, the data is encoded by an error correction code (ECC) low-density parity check (LDPC) encoder to generate redundant information. The redundant information is known as parity bits. The parity bits and the data are stored as an ECC codeword.

When the ECC codeword is read from the data storage device, a decoder, such as a LDPC decoder, decodes the codeword and corrects any errors that may be present. Typically, the LDPC decoder is used to correct random errors that occur on the data storage device.

However, a LDPC decoder cannot handle colossal errors that may occur as a result of memory defects and/or failures. As such, a data storage device may also incorporate a redundant array of independent dies (RAID) storage scheme which is aimed at handling errors that occur as a result of physical defects. For example, the RAID storage scheme distributes the data, along with first parity information and second parity information, in a stripe across multiple different solid state drives (SSDs) or across multiple different memory dies in a single SSD. The parity information enables recovery of the data in the stripe in case one of the SSDs or memory dies fail.

In some examples, LDPC decoding and RAID decoding are combined to increase the chances that errors are correctable. For example, if multiple pages have failed a decoding operation, the RAID-based decoding scheme is implemented on the page followed by the LDPC decoding scheme. This process is repeated for each failed page.

However, if an initial decoding process fails to decode or correct a particular failed page, it is possible that the particular page may be successfully decoded during another iteration. For example, if another failed page has been successfully decoded, information corresponding to the now corrected page may be used to correct the errors in the particular failed page. Thus, multiple decoding processes may be executed on the same failed page. However, each time a decoding process is executed on the same page, the latency of decoding increases.

Accordingly, it would be beneficial to reduce the latency of a decoding process that implements a two different decoding schemes.

SUMMARY

The present disclosure describes an error correction code (ECC) ordering system for a data storage device. In an example, the ECC ordering system is part of, or is otherwise associated with, an error correction code (ECC) system of a data storage device. The ECC ordering system determines a decoding order or a decoding schedule in which two or more flash memory units (FMUs) that have failed an initial decoding process are to be decoded using a joint decoding scheme. In an example, the joint decoding scheme includes a first decoding scheme (e.g., a LDPC decoding scheme) and second decoding scheme (e.g., a RAID decoding scheme).

For example, the FMUs are associated with, or are otherwise included in, a RAID or XOR stripe of the second decoding scheme. When two or more FMUs have failed an initial decoding process, the ECC ordering system determines, based on one or more metrics associated with the two or more FMUs, the order in which the FMUs will be decoded using the joint decoding scheme. When the order is determined, the ECC system executes the joint decoding scheme on the FMUs in the determined order.

In one example, the metric on which the decoding schedule is based is a syndrome weight of each FMU. In another example, the metric on which the decoding schedule is based is a combined bit error rate (BER) of each FMU. In an example, the combined BER indicates a quality of one or more soft bits associated with each FMU and a quality of the FMU.

Accordingly, examples of the present disclosure describe a method that includes identifying two or more FMUs associated with a data storage device that have failed an initial decoding operation executed by an error code correction system of the data storage device. The method also includes determining a metric associated with each of the two or more FMUs. A decoding schedule for the two or more FMUs is generated. In an example, the decoding schedule is based, at least in part, on the metric associated with each of the two or more FMUs. A joint decoding operation is then executed on the first FMU of the two or more FMUs based on the generated decoding schedule using a joint decoding scheme. In an example, the joint decoding scheme includes a first decoding scheme and a second decoding scheme.

Other examples describe a data storage device that includes a controller and an error correction code (ECC) system associated with the controller. In an example, the ECC system is operable to execute an initial decoding operation on FMUs associated with a stripe and determine whether any FMUs failed the initial decoding operation. If the ECC system determines that two or more FMUs failed the initial decoding operation, the ECC system determines a metric associated with each of the two or more FMUs and determines an order in which each of the two or more FMUs will undergo a joint decoding operation using a joint decoding scheme. In an example, the order in which the two or more FMUs will be decoded is based, at least in part, on the metric associated with each of the two or more FMUs. Additionally, the joint decoding scheme includes a first decoding scheme and a second decoding scheme. The ECC system also executes the joint decoding operation on the two or more FMUs in the determined order.

Still other examples describe a data storage device that includes a control means and an error correction means associated with the control means. In an example, the error correction means determines whether two or more memory means associated with the data storage device have failed an initial decoding operation. Based, at least in part, on a determination that two or more memory means have failed the initial decoding operation, the error correction means determines a first metric associated with a first memory means of the two or more memory means and determines a second metric associated with a second memory means of the two or more memory means. The control means compares the first metric and the second metric and generates a decoding schedule based, at least in part, on the comparison between the first metric and the second metric. The error correction means also executes a joint decoding operation using a joint decoding scheme on at least one of the first memory means and the second memory means based, at least in part, on the decoding schedule. In an example, the joint decoding scheme includes a first decoding scheme and a second decoding scheme.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
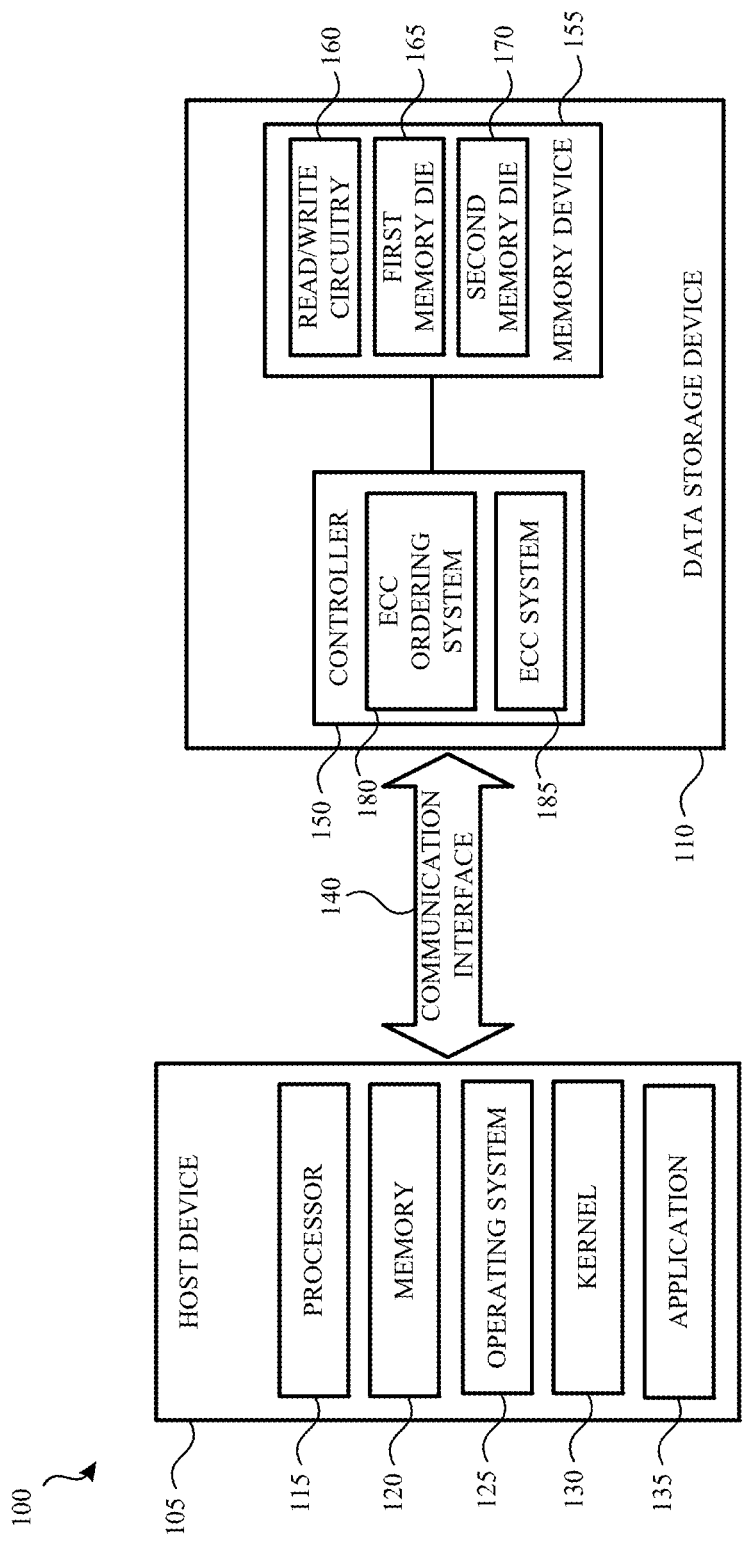
FIG. 1 is a block diagram of a system that includes a host device and a data storage device according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

Typically, data storage devices include error correction capabilities to correct errors that occur when data is read from the data storage device. For example, and as previously discussed, when data is written to the data storage device, the data is encoded by an error correction code (ECC) encoder (e.g., a LDPC encoder) and parity bits are generated. The parity bits are combined with the data and stored as an ECC codeword.

When the ECC codeword is read from the data storage device, a decoder (e.g., a LDPC decoder) decodes the codeword and corrects any errors that may be present. Typically, a LDPC decoder is used to correct random errors that occur on the data storage device. For example, the LDPC decoder corrects errors up to a particular bit error rate (BER).

The data storage device can also incorporate a RAID encoding/decoding scheme. For example, the RAID encoding/decoding scheme distributes data, along with first parity information and second parity information, in a stripe across multiple different solid state drives (SSDs) or across multiple memory dies in a single SSD. The parity information enables recovery of the data in the stripe in case one of the SSDs or memory dies fail or if a BER of one flash memory unit (FMU) exceeds a maximum BER that the LDPC decoder can handle.

As previously described, some data storage devices implement a joint LDPC and RAID decoding scheme that has the ability to correct multiple FMUs that have failed an initial decoding process. For example, if multiple FMUs have failed an initial decoding operation, the joint decoding scheme is implemented on a first failed FMU and is repeated for each failed FMU in an order that is based on an index of the stripe.

While the joint decoding scheme may have the ability to correct more errors when compared with a separate RAID decoding scheme and a separate LDPC decoding scheme, the joint decoding scheme is not without drawbacks. For example, if multiple FMUs fail the initial decoding process, the joint decoding scheme is executed based on the index of the FMUs. Thus, if FMU 2 (located at index two in the stripe) and FMU 4 (located at index four in the stripe) failed the initial decoding process, the joint decoding scheme would be executed on FMU 2 followed by FMU 4.

However, if an initial pass of the joint decoding scheme fails to decode or correct FMU 2, it is possible that FMU 2 may be successfully decoded during another iteration. For example, if the joint decoding scheme successfully decodes FMU 4, the corrected information in FMU 4 may be used to correct the errors in FMU 2. Thus, multiple decoding processes may be executed on the same failed FMU, which increases the latency of the decoding process.

To address the above, the present disclosure describes an ECC ordering system for a data storage device. In an example, the ECC ordering system is part of, or is otherwise associated with, an ECC system of the data storage device. The ECC ordering system determines an order or a schedule in which two or more FMUs that have failed an initial decoding process are to be decoded using a joint decoding scheme. In an example, the joint decoding scheme includes a first decoding scheme (e.g., a LDPC decoding scheme) and second decoding scheme (e.g., a RAID decoding scheme).

For example, the FMU's are associated with or are otherwise included in a stripe (e.g., a RAID or XOR stripe) of the second decoding scheme. When two or more FMUs have failed an initial decoding process (e.g., the BER of the FMUs exceed the correction capabilities of the first decoding scheme), the ECC ordering system determines, based on one or more metrics of the two FMUs, the order in which the FMUs will be decoded using the joint decoding scheme. When the order is determined, the ECC system executes the joint decoding scheme on the FMUs in the determined order.

In one example, the metric on which the order of the schedule is based is a syndrome weight of each FMU. In another example, the metric on which the order of the schedule is based, at least in part on a combined BER of the FMU. In an example, the combined BER represents a quality of one or more soft bits associated with each FMU and/or a quality of the FMU. For example, the combined BER indicates a likelihood that the FMU will be successfully decoded. As such, the FMUs are ordered from the most likely to be decoded to the least likely to be decoded. However, as more FMUs are successfully decoded, the higher the likelihood that subsequent FMUs will be decoded. As such, repeated iterations of attempting to decode failed FMUs are reduced or eliminated.

In accordance with the above, many technical benefits may be realized including, but not limited to, reducing decode latency by reducing the number of joint decoding iterations on failed FMUs which increases the quality of service in a data storage device and improving the effective error correction capability of a data storage device.

These benefits, along with other examples, will be shown and described in greater detail with respect to FIG. 1-FIG. 7.

FIG. 1 is a block diagram of a system 100 that includes a host device 105 and a data storage device 110 according to an example. In an example, the host device 105 includes a processor 115 and a memory 120 (e.g., main memory). The memory 120 includes or is otherwise associated with an operating system 125, a kernel 130 and/or an application 135.

The processor 115 can execute various instructions, such as, for example, instructions from the operating system 125 and/or the application 135. The processor 115 includes circuitry such as a microcontroller, a Digital Signal Processor (DSP), an Application-Specific Integrated Circuit (ASIC), a Field Programmable Gate Array (FPGA), hard-wired logic, analog circuitry and/or various combinations thereof. In an example, the processor 115 includes a System on a Chip (SoC).

In an example, the memory 120 is used by the host device 105 to store data used, or otherwise executed by, the processor 115. Data stored in the memory 120 includes instructions provided by the data storage device 110 via a communication interface 140. The data stored in the memory 120 also includes data used to execute instructions from the operating system 125 and/or one or more applications 135. The memory 120 may be a single memory or may include multiple memories, such as, for example one or more non-volatile memories, one or more volatile memories, or a combination thereof.

In an example, the operating system 125 creates a virtual address space for the application 135 and/or other processes executed by the processor 115. The virtual address space maps to locations in the memory 120. The operating system 125 also includes or is otherwise associated with a kernel 130. The kernel 130 includes instructions for managing various resources of the host device 105 (e.g., memory allocation), handling read and write requests and so on.

The communication interface 140 communicatively couples the host device 105 and the data storage device 110. The communication interface 140 may be a Serial Advanced Technology Attachment (SATA), a PCI express (PCIe) bus, a Small Computer System Interface (SCSI), a Serial Attached SCSI (SAS), Ethernet, Fibre Channel, or Wi-Fi. As such, the host device 105 and the data storage device 110 need not be physically co-located and may communicate over a network such as a Local Area Network (LAN) or a Wide Area Network (WAN), such as the internet. In addition, the host device 105 may interface with the data storage device 110 using a logical interface specification such as Non-Volatile Memory express (NVMe) or Advanced Host Controller Interface (AHCI).

The data storage device 110 includes a controller 150 and a memory device 155. In an example, the controller 150 is communicatively coupled to the memory device 155. The memory device 155 includes one or more memory dies (e.g., a first memory die 165 and a second memory die 170). Although memory dies are specifically mentioned, the memory device 155 may include any non-volatile memory device, storage device, storage elements or storage medium including NAND flash memory cells and/or NOR flash memory cells.

The memory cells can take the form of solid-state (e.g., flash) memory cells and can be one-time programmable, few-time programmable, or many-time programmable. Additionally, the memory cells may be single-level cells (SLCs), multi-level cells (MLCs), triple-level cells (TLCs), quad-level cells (QLCs), penta-level cells (PLCs), and/or use any other memory technologies. In one example, the memory cells are arranged in a two-dimensional configuration. In another example, the memory cells are arranged in a three-dimensional configuration.

In an example, the data storage device 110 is attached to or embedded within the host device 105. In another example, the data storage device 110 is implemented as an external device or a portable device that can be communicatively or selectively coupled to, and removed from, the host device 105. In yet another example, the data storage device 110 is a component (e.g., a solid-state drive (SSD)) of a network accessible data storage system, a network-attached storage system, a cloud data storage system, or the like.

As indicated above, the memory device 155 of the data storage device 110 includes a first memory die 165 and a second memory die 170. Although two memory dies are shown, the memory device 155 may include any number of memory dies (e.g., one memory die, two memory dies, eight memory dies, or another number of memory dies).

The memory device 155 also includes support circuitry. In an example, the support circuitry includes read/write circuitry 160. The read/write circuitry 160 supports the operation of the memory dies of the memory device 155. Although the read/write circuitry 160 is depicted as a single component, the read/write circuitry 160 may be divided into separate components, such as, for example, read circuitry and write circuitry. The read/write circuitry 160 may be external to the memory dies of the memory device 155. In another example, one or more of the memory dies may include corresponding read/write circuitry 160 that is operable to read data from and/or write data to storage elements within one individual memory die independent of other read and/or write operations on any of the other memory dies.

In an example, one or more of the first memory die 165 and the second memory die 170 include one or more memory blocks. In an example, each memory block includes one or more memory cells. A block of memory cells is the smallest number of memory cells that are physically erasable together. In an example and for increased parallelism, each of the blocks may be operated or organized in larger blocks or metablocks. For example, one block from different dies of memory may be logically linked together to form a metablock.

Figure 2A:
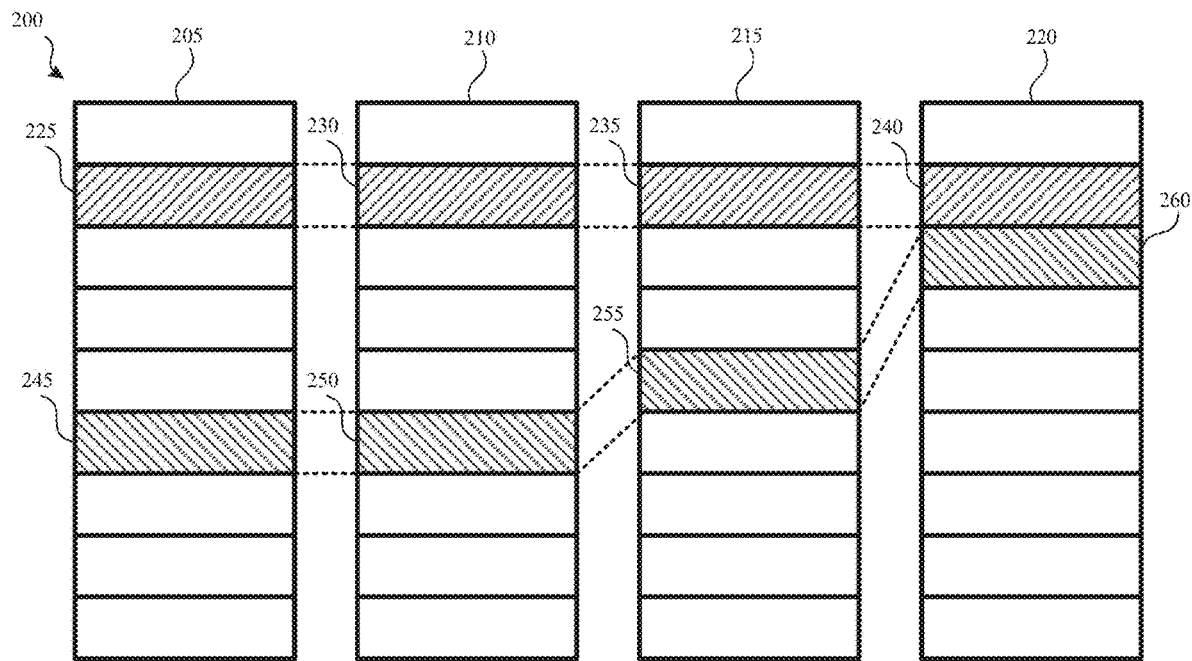
FIG. 2A illustrates how a memory device includes a number of memory blocks according to an example.

For example and referring to FIG. 2A, FIG. 2A illustrates how a memory device 200 includes a number of memory blocks according to an example. For example, the memory device 200 (e.g., a storage element, a memory die, a non-volatile memory device) includes four planes or sub-arrays (e.g., a first plane 205, a second plane 210, a third plane 215, and a fourth plane 220). In an example, the planes are integrated on a single memory die. In another example, the planes are provided on two different memory dies (e.g., two planes on each memory die). In yet another example, the planes are provided on four separate memory dies. Although four planes are shown and described, the memory device 200 may have any number of planes and/or memory dies.

In an example, each plane is divided into memory blocks consisting memory cells. As shown in FIG. 2A, the rectangles represent a memory block, such as memory block 225, memory block 230, memory block 235 and memory block 240. There may be dozens or hundreds of memory blocks in each plane of the memory device 200. In an example, each memory block is a unit of erase and is sometimes referred to as an erase block. For example, memory block 225, memory block 230, memory block 235 and memory block 240 include a minimum number of memory cells that are erased together.

In addition, various memory blocks are logically linked or grouped together (e.g., using a table in or otherwise accessible by the controller 150 (FIG. 1)) to form a metablock. A metablock is written to, read from and/or erased as a single unit. For example, memory block 225, memory block 230, memory block 235 and memory block 240 form a first metablock while memory block 245, memory block 250, memory block 255 and memory block 260 form a second metablock. The memory blocks used to form a metablock need not be restricted to the same relative locations within their respective planes.

Figure 2B:
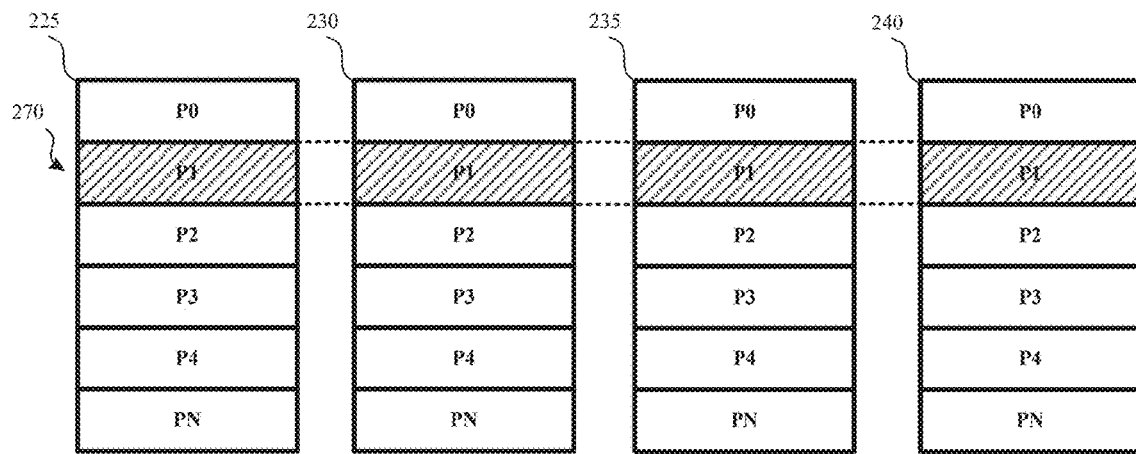
FIG. 2B illustrates how a memory block includes one or more pages according to an example.

In an example, each memory block is divided, for operational purposes, into pages of memory cells. For example and referring to FIG. 2B, FIG. 2B illustrates how a memory block includes one or more pages according to an example. For example, the memory cells of memory block 225, memory block 230, memory block 235 and memory block 240 are divided into N different pages (shown as P0-PN). Although a specific number of pages are shown in FIG. 2B, a memory block may have any number of pages of memory cells within each memory block.

In an example, a page is a unit of data programming within the memory block. Each page includes the minimum amount of data that can be programmed at one time. The minimum unit of data that can be read at one time may be less than a page. For example, each page is further dividable into segments or units and each segment includes the fewest number of memory cells that may be written to at one time as a basic programming operation. Data that is stored in a segment or a unit of memory cells is referred to herein as a flash memory unit (FMU). A FMU may be a page, an ECC page, a codeword or otherwise include an amount of data that is written at one time during a basic programming operation and/or the amount of data that can be encoded and/or decoded by a ECC system (e.g., ECC system 185 (FIG. 1)) during a single encoding and/or decoding operation.

A metapage 270 is illustrated in FIG. 2B as being formed of one physical page from memory block 225, memory block 230, memory block 235 and memory block 240. In the example, shown, the metapage 270 includes page P1 in each of the four memory blocks. However, the pages of the metapage 270 need not have the same relative position within each of the memory blocks. A metapage 270 may be the maximum unit of programming within a memory block.

The memory blocks disclosed in FIG. 2A-FIG. 2B are referred to herein as physical memory blocks because they relate to groups of physical memory cells as discussed above. As used herein, a logical memory block is a virtual unit of address space defined to have the same size as a physical memory block. Each logical memory block includes a range of logical memory block addresses (LBAs) that are associated with data received from a host. The LBAs are then mapped to one or more physical memory blocks in the data storage device 110 where the data is physically stored.

As indicated above, each memory block may include any number of memory cells. The design, size, and organization of a memory block may depend on the architecture, design, and application desired for each memory die. In an example, the memory block includes a contiguous set of memory cells that share a plurality of word lines and bit lines.

Figure 2C:
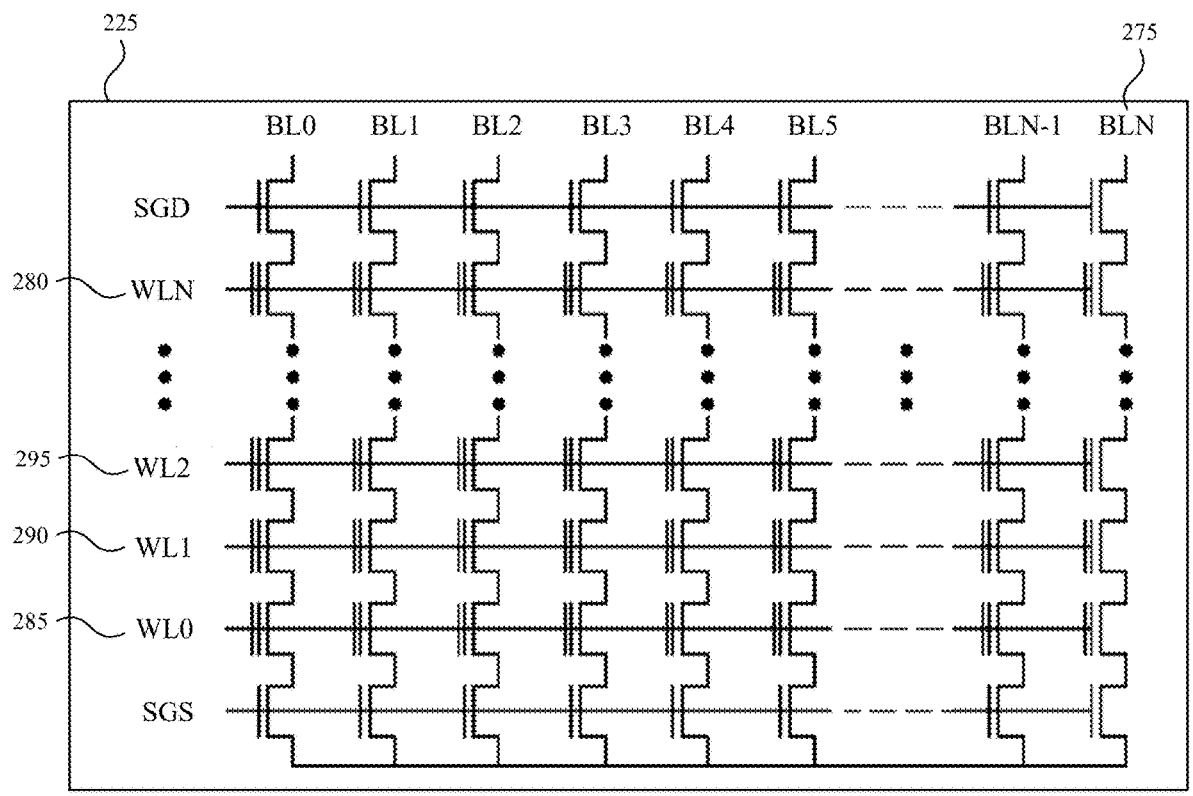
FIG. 2C illustrates how a memory block includes a number of bit lines and word lines according to an example.

FIG. 2C illustrates how a memory block includes a number of bit lines 275 and word lines 280 according to an example. For example and as shown in FIG. 2C, the memory block 225 includes bit lines BL0-BLN (collectively bit lines 275), where N is a total number of bit lines. Additionally, the memory block 225 includes word lines WL0-WLN (collectively word lines 280), where N is a total number of word lines. In an example, multiple memory blocks can share the same bit line.

A word line 280 may function as a single-level-cell (SLC) word line, a multi-level-cell (MLC) word line, a tri-level-cell (TLC) word line, a quad-level cell (QLC) word line, a penta-level cell (PLC) word line and so on. Additionally, each memory cell may be programmable to a state (e.g., a threshold voltage in a flash configuration or a resistive state in a resistive memory configuration) that indicates one or more values.

In the example shown in FIG. 2C, four memory cells are connected in series to form a NAND string. Although four memory cells are depicted, any number of memory cells (e.g., 16, 32, 64, 128, 256 or any other number or memory cells) may be used. One terminal of the NAND string is connected to a corresponding bit line via a drain select gate (connected to select gate drain line SGD) and another terminal of the NAND string is connected to a source line via a source select gate (connected to select gate source line SGS). Additionally, although eight bit lines are shown in FIG. 2C, any number of bit lines may be used.

Referring back to FIG. 1, as previously described, the data storage device 110 also includes a controller 150. Although a single controller 150 is shown and described, the data storage device 110 can include multiple controllers. In such an example, a first controller executes a first operation or set of operations and the second controller executes a second operation or set of operations. In an example, the first set of operations and the second set of operations are executed on the same memory dies. In other examples, the first set of operations is executed on a first memory die or a first set of memory dies and the second set of operations is executed on a second memory die or a second set of memory dies.

The controller 150 is communicatively coupled to the memory device 155 via a bus, an interface or other communication circuitry. In an example, the communication circuitry includes one or more channels to enable the controller 150 to communicate with the first memory die 165 and/or the second memory die 170 of the memory device 155. In another example, the communication circuitry includes multiple distinct channels which enables the controller 150 to communicate with the first memory die 165 independently and/or in parallel with the second memory die 170 of the memory device 155.

The controller 150 receives data and/or instructions from the host device 105. The controller 150 also sends data to the host device 105. For example, the controller 150 sends data to and/or receives data from the host device 105 via the communication interface 140. The controller 150 also sends data and/or commands to, and/or receive data from, the memory device 155.

The controller 150 sends data and a corresponding write command to the memory device 155 to cause the memory device 155 to store data at a specified address of the memory device 155. In an example, the write command specifies a physical address of a portion of the memory device 155. The controller 150 also sends data and/or commands associated with one or more background scanning operations, garbage collection operations, and/or wear leveling operations.

The controller 150 also sends one or more read commands to the memory device 155. In an example, the read command specifies the physical address of a portion of the memory device 155 at which the data is stored. The controller 150 also tracks the number of program/erase cycles or other programming operations that have been performed on or by the memory device and/or the memory dies of the memory device 155.

The controller 150 also includes, or is otherwise associated with, a ECC system 185 and/or an ECC ordering system 180. In an example, the ECC system 185 and/or the ECC ordering system 180 is a packaged functional hardware unit designed for use with other components/systems. In another example, the ECC system 185 and/or the ECC ordering system 180 is a portion of a program code (e.g., software or firmware) executable by a processor or processing circuitry. In yet another example, the ECC system 185 and/or the ECC ordering system 180 is a self-contained hardware and/or software component that interfaces with other components and/or systems. Although the ECC system 185 and the ECC ordering system 180 are shown as being part of the controller 150, the ECC system 185 and/or the ECC ordering system 180 may be separate from the controller 150.

In an example, the ECC system 185 receives data to be stored to the memory device 155 and generates a codeword. For example, the ECC system 185 includes an encoder that encodes data using a first encoding scheme. In an example, the first encoding scheme is an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof.

For example, when the data is received, the ECC system 185 of the controller 150 encodes the data into one or more codewords. The codewords are then stored in the memory device 155 (or another location). For example, when the data is received, the data is partitioned into N data words. A first portion of the data corresponds to a first data word and an Nth data word corresponds to a last data word of the data. The ECC system 185 encodes the first data word to generate a first codeword (that includes data and associated parity bits) and encodes a second data word to generate a second codeword. This repeats for all N data words.

Additionally, the ECC system 185 includes an encoder that encodes data according to a second encoding scheme. In an example, the second encoding scheme is a RAID or XOR encoding scheme that generates stipe parity data. For example, when codewords corresponding to the N data words have been generated (e.g., resulting in N codewords), the ECC system 185 utilizes the second encoding scheme to generate stripe parity data that corresponds to multiple columns of multiple bits from each of the N codewords. For example, the ECC system 185 is configured to generate first parity data that corresponds to a first stripe codeword by encoding first portions of each of the N codewords. The ECC system 185 generates a second stripe codeword by encoding second portions of each of the N codewords. This process repeats for each portion of the codewords.

The ECC system 185 also includes a first decoder that decodes data using a first decoding scheme and a second decoder that decodes data using a second decoding scheme. In an example, the first decoding scheme is an LDPC decoding scheme and the second decoding scheme is a RAID or XOR decoding scheme. In an example, the first decoding scheme is used to decode the generated codewords and the second decoding scheme is used to decode the stripe codewords.

In an example, when the codewords are decoded, the ECC system 185 may determine that the codewords include various errors. In some examples, the number of errors may exceed the correction capabilities of the first decoding scheme. In another example, a number of failed codewords may exceed the correction capabilities of the first decoding scheme and/or the second decoding scheme. In such examples, a joint decoding scheme is used to correct the errors. In an example, the joint decoding scheme utilizes the first decoding scheme and the second decoding scheme to correct various errors that are detected by the ECC system 185.

Figure 3A:
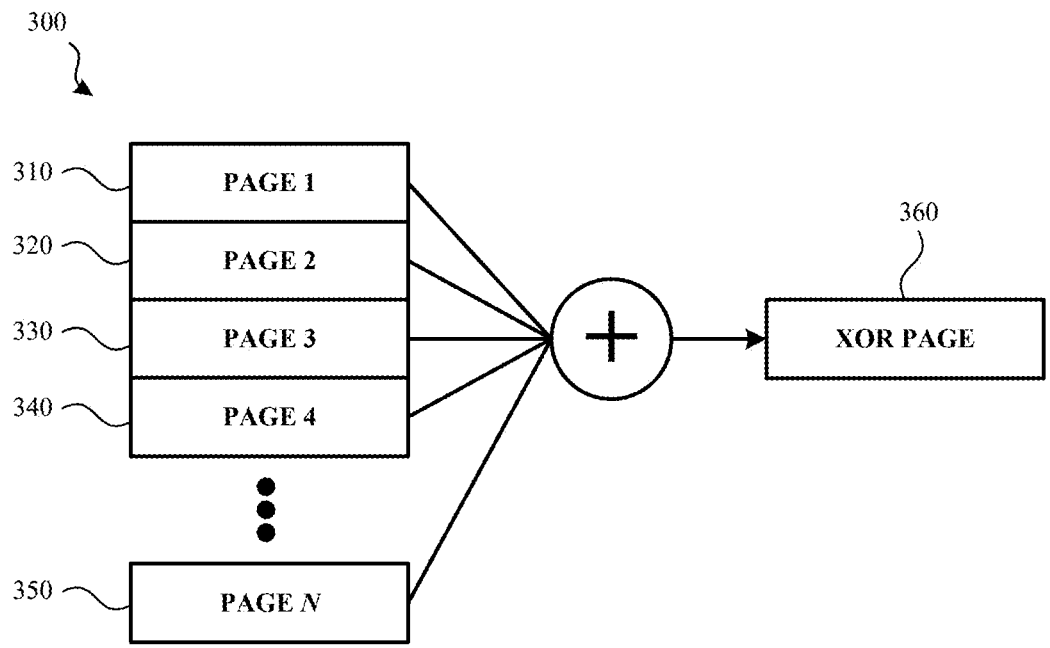
FIG. 3A illustrates how multiple pages in a stripe are combined to form parity information according to an example.

FIG. 3A illustrates how multiple pages in a stripe 300 are combined to form parity information 360 according to an example. In an example, the pages in the stripe 300 are FMUs that are equivalent to codewords or portions of codewords that were encoded using the first encoding scheme.

For example, the stripe 300 includes data corresponding to N pages-Page 1 310, Page 2 320, Page 3 330, Page 4 340 and Page N 350. In this example, each of the pages are XORed together (e.g., during a write or an encoding operation) to generate parity information 360 (represented as a XOR page) using a RAID or XOR type encoding scheme.

Figure 3B:
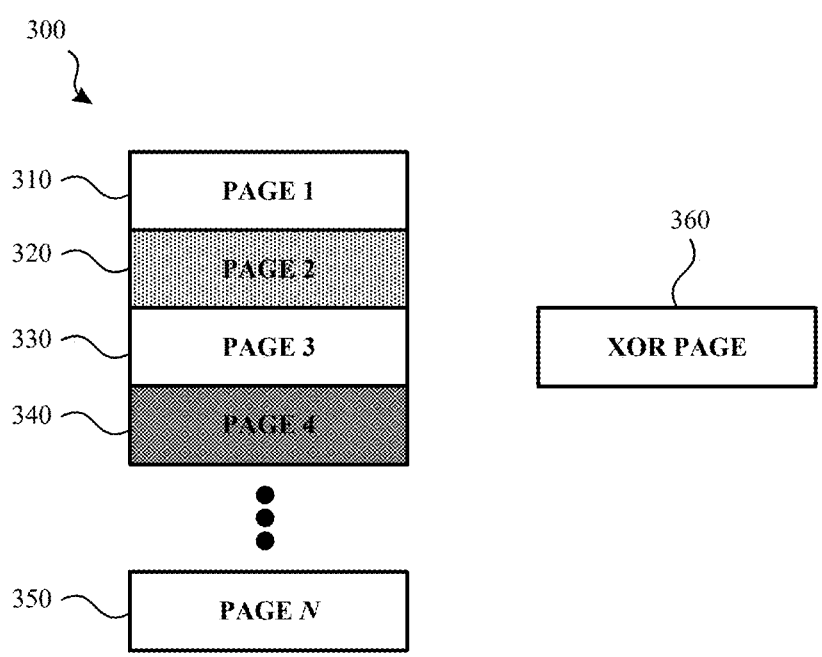
FIG. 3B illustrates that Page 2 and Page 4 in the stripe have failed a decoding process according to an example.

During a decoding operation, an ECC system (e.g., the ECC system 185 (FIG. 1)) determines that two of the pages in the stripe 300 were not decoded successfully. For example and referring to FIG. 3B, FIG. 3B illustrates that Page 2 320 and Page 4 340 in the stripe 300 have failed a decoding process. In an example, the decoding process that failed is an LDPC decoding process.

Figure 3C:
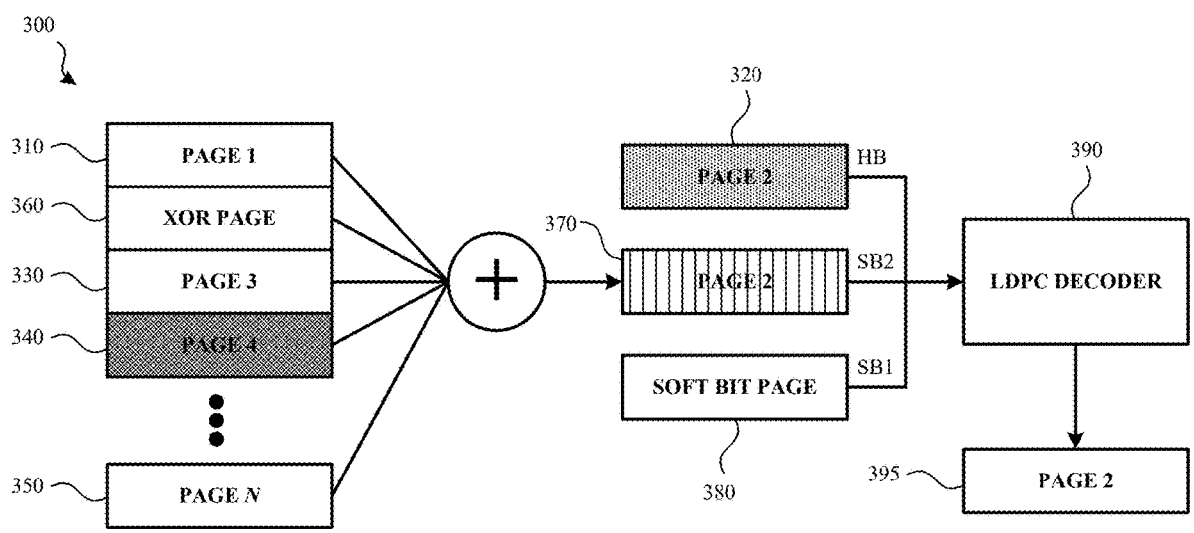
FIG. 3C illustrates how a joint decoding scheme is used to correct errors in pages of the stripe according to an example.

FIG. 3C illustrates how a joint decoding scheme is used to correct errors in pages of the stripe 300 according to an example. For example, when the ECC system determines that Page 2 320 and Page 4 340 have failed the decoding process and/or has otherwise determined the pages are uncorrectable, the ECC system implements the joint decoding scheme. For example and as shown in FIG. 3C, the ECC system determines a hard bit that will be provided to a LDPC decoder 390 and two soft bits that will be provided to the LDPC decoder 390 when Page 2 320 is decoded.

In an example, the hard bit (represented in FIG. 3C as HB) is a copy (e.g., an uncorrected copy) of Page 2 320. The first soft bit (represented as soft bit page 380 or SB1) is a natural soft bit page (or a soft bit representation of) Page 2 320. The second soft bit (SB2) is a XOR representation of Page 2 370.

For example, in order to generate the XOR representation of Page 2 370, the ECC system XORs Page 1 310, Page 3 330, Page 4 340, Page N 350 with the parity information 360 (e.g., the XOR page) that was generated when the data was written/encoded. Page 2 320, the XOR representation of Page 2 370 and the soft bit page 380 are provided to the LDPC decoder 390 to generate a corrected Page 2 395.

In an example, if the ECC system determines that Page 2 320 was successfully decoded (e.g., resulting in corrected Page 2 395), the corrected Page 2 395 is used by the ECC system to correct the errors in Page 4 340. This process is repeated for each failed page in the stripe.

However, in some examples, Page 2 320 may not be successfully decoded during the initial iteration. As such, the ECC system attempts to decode and correct Page 4 340 using similar operations. If Page 4 340 was successfully decoded and corrected, the ECC system attempts to decode and correct Page 2 320 with the now corrected Page 4.

A detailed explanation of the joint decoding scheme is described in more detail in U.S. Pat. No. 9,940,194, titled "ECC Decoding Using RAID-Type Parity", the entire disclosure of which is hereby incorporated by reference in its entirety.

Referring back to FIG. 1 and as briefly described above, the ECC system 185 includes or is otherwise associated with an ECC ordering system 180. The ECC ordering system 180 determines one or more metrics associated with each failed FMU or page (e.g., Page 2 320 (FIG. 3B)) and determines, based on the one or more metrics, a schedule or order in which the pages are decoded and/or corrected using the joint decoding scheme. In an example, the schedule or order is based, at least in part, on a likelihood that the FMUs will be decoded and corrected.

For example, if the ECC ordering system 180 determines, based on one or more metrics associated with Page 4 340 and Page 2 320 (FIG. 3B), that Page 4 340 is more likely to be corrected using parity information (e.g., the XOR page) when compared with Page 2 320. As such, the ECC ordering system 180 causes the joint decoding scheme to be executed on Page 4 340 prior to Page 2 320.

In this example, Page 4 340 is corrected by the joint decoding scheme. As such, the now corrected Page 4 can be used to correct the errors in Page 2 320. Because Page 4 340 was corrected, the likelihood that Page 2 320 is also corrected by the joint decoding scheme increases.

When compared with the current solutions in which multiple iterations may be needed to determine whether or not one or more FMUs are correctable, the latency of the decoding operations associated with the present disclosure is reduced because the order of FMUs is based on the likelihood of success. Thus, if Page 4 340 is not decodable and/or correctable using the joint decoding scheme, there may be no need to try and correct Page 2 320 (e.g., because Page 4 340 was not corrected). However, it is contemplated that even if joint decoding scheme fails to correct the errors of Page 4 340, the joint decoding scheme may still be executed on Page 2 320.

In an example, the metric is a syndrome weight associated with the FMU. The syndrome weight is an estimate of an underlaying bit error rate (BER) of the FMU. For example, the syndrome weight identifies a number of errors that are correctable by the ECC system 185. Thus, when determining the order in which the joint decoding scheme is to be applied to the various failed FMUs, the ECC ordering system 180 determines the syndrome weight of each failed FMU and orders the FMUs from the lowest syndrome weight to the highest syndrome weight. The ECC system 180 will then initiate the joint decoding scheme on the failed FMUs in the determined order.

In another example, the metric is based, at least in part, on a combined BER of a FMU. In an example, the combined BER of the FMU is based, at least in part, on a quality of a decoded FMU and the quality of soft bit information (e.g., Page 2 370 or SB2 (FIG. 3C)) that was generated from all of the FMUs in a stripe.

For example and referring back to FIG. 3C, the combined BER associated with Page 2 320 is determined by combining Page 2 320 with the XOR representation of Page 2 370. When the combined BER is determined for each FMU, the ECC ordering system 180 initiates the joint decoding operations using the combined BER.

In an example, the combined BER of a failed FMU is determined by measuring a syndrome weight of the failed FMU. When the syndrome weight is determined, a $BER_{XOR}$ of the failed FMU is determined. In an example, the $BER_{XOR}$ of the failed FMU is calculated using the following equation: $BER_{XOR} = \frac{1}{2} \cdot (1-(1-2 \cdot BER)^{t-1})$, where t is a number of fails within the XOR page.

When $BER_{XOR}$ has been determined, the ECC ordering system 180 uses the syndrome weight to estimate the BER of the failed FMU. For example, the syndrome weight of the failed FMU is used to derive a Gaussian sigma of the BER using a Gaussian distribution assumption of sigma ("$\sigma$") in which $\sigma = \frac{1}{2} Q^{-1}(BER_1)$, where $$Q(x) = \int_X^\infty \frac{1}{\sqrt{2\pi}} e^{-v^2/2} dv.$$

In an example, the estimated BER of the failed FMU is represented as $BER_1$. In the equation above, it is presumed that the failed FMU has a Normal Cell Voltage Distribution with $STD = \sigma$.

In an example, the soft bit page of the failed FMU is generated by reading a ±delta ("$\Delta$") around a hard bit level associated with the failed FMU. In an example, the delta indicates the number of cells inside a soft bit region and the number of cells outside the soft bit region. For example, the delta indicates the number of bits that are reliable and the number of bit that are unreliable. As such, $BER_1 = \alpha \cdot BER_{HIGH} + (1-\alpha) \cdot BER_{LOW} = Q(\frac{1}{2}\sigma)$.

When the BER is estimated, alpha ("$\alpha$") is calculated from the syndrome weight and the Gaussian distribution. In an example, $\alpha$ is calculated using the following equation:

$$\alpha = Q\left(\frac{0.5-\Delta}{\sigma}\right) - Q\left(\frac{0.5+\Delta}{\sigma}\right).$$

When $\alpha$ has been calculated, $BER_{HIGH}$ and $BER_{LOW}$ are calculated using the following equations:

$$BER_{HIGH} = Q\left(\frac{0.5}{\sigma}\right) - Q\left(\frac{0.5+\Delta}{\sigma}\right)/\alpha;\ BER_{LOW} = Q\left(\frac{0.5+\Delta}{\sigma}\right)/(1-\alpha).$$

The ECC ordering system then calculates the combined BER from $\alpha$, $BER_{LOW}$ and $BER_{XOR}$ using the following equation:

$$BER_{COMBINED} =$$
$$(BER_1, BER_2, \ldots BER_N | \Delta) = \alpha \cdot BER_{XOR}(BER_2, \ldots BER_N) +$$
$$(1-\alpha) \cdot BER_{LOW} \leq \alpha \cdot \frac{1-(1-2 \cdot BER\max)^t}{2} + (1-\alpha).$$

$BER_{LOW}$. As previously discussed, when the combined BER of each failed FMU is determined, the ECC ordering system orders the failed FMUs using the combined BER. The ECC system 180 then initiates the joint decoding scheme on the failed FMUs in the specified order.

Figure 4A:
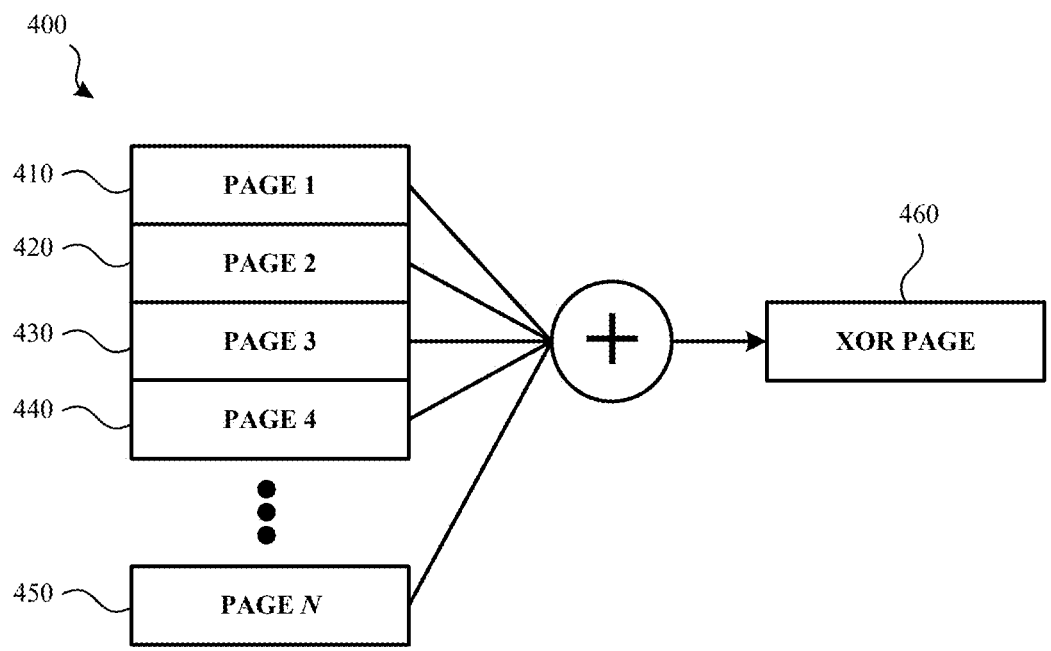
FIG. 4A illustrates how multiple pages in a stripe are combined to form parity information according to an example.

FIG. 4A illustrates how multiple pages in a stripe 400 are combined to form parity information 460 according to an example. In an example, the pages in the stripe 400 are combined in a similar manner as the pages in the stripe 300 shown and described with respect to FIG. 3A. For example, the stripe 400 includes data corresponding to N pages-Page 1 410, Page 2 420, Page 3 430, Page 4 440 and Page N 450. Each of the pages are XORed together (e.g., during a write or an encoding operation) to generate the parity information 460.

Figure 4B:
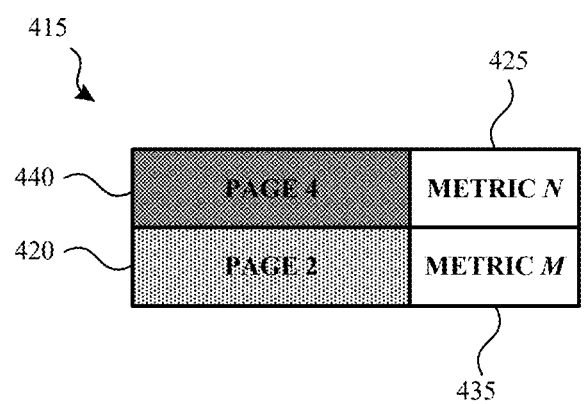
FIG. 4B illustrates how Page 2 and Page 4 in the stripe are ordered based on a determination that Page 2 and Page 4 have failed a decoding process according to an example.

Like the example shown and described with respect to FIG. 3B, during a decoding operation, an ECC system (e.g., the ECC system 185 (FIG. 1)) determines that two of the pages in the stripe 400 have failed an initial decoding operation and/or are uncorrectable using the first decoding scheme or the second decoding scheme. For example and referring to FIG. 4B, FIG. 4B illustrates that Page 2 420 and Page 4 440 have failed a decoding operation.

When the ECC system determines the pages in the stripe have failed the initial decoding operation, the ECC ordering system generates or otherwise determines one or more metrics associated with each failed page. For example and as previously discussed, the ECC ordering system determines a BER associated with each failed page. In another example, the ECC ordering system determines a combined BER associated with each failed page.

When the one or more metrics associated with each failed page have been determined, the ECC ordering system generates a schedule 415 based on the one or more metrics associated with each failed page. For example, the ECC ordering system compares the Metric N 425 associated with Page 4 440 with the Metric M associated with Page 2 420 and determines, based on the comparison, that Page 4 440 has a higher likelihood of being successfully decoded when compared with Page 2 420. As such, when the joint decoding scheme is executed on the failed pages, Page 4 440 will be decoded before Page 2 420.

Figure 4C:
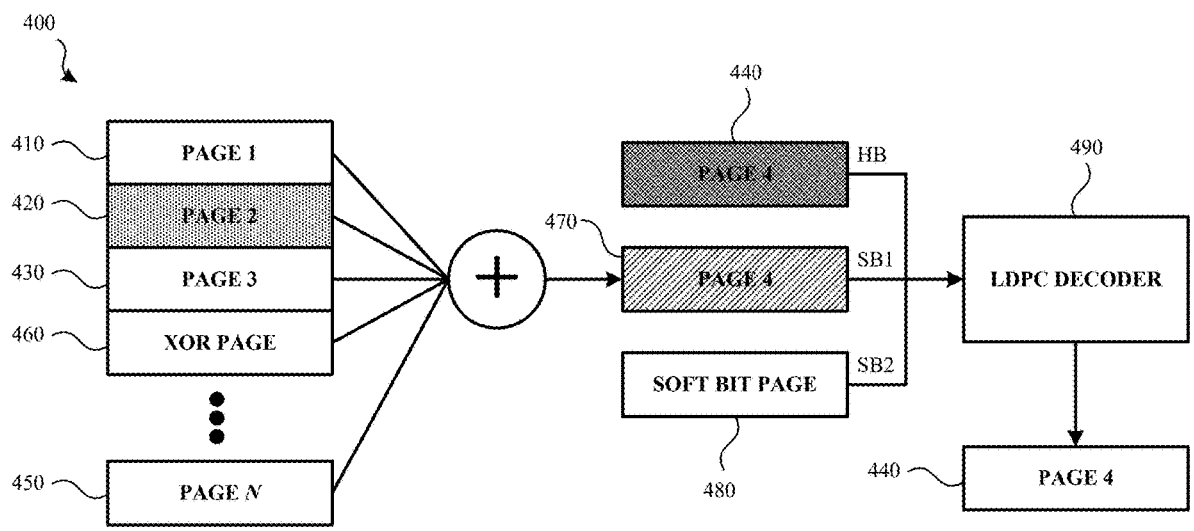
FIG. 4C illustrates how a joint decoding scheme is used to correct errors in pages based on a determined order according to an example.

FIG. 4C illustrates how a joint decoding scheme is used to correct errors in pages of the stripe 400 based on determined metrics according to an example. For example, when the ECC system determines that Page 2 420 and Page 4 440 have failed the initial decoding process and/or has otherwise determined the pages are uncorrectable, the ECC system implements the joint decoding scheme in the order determined by the schedule 415.

For example, because Page 4 440 has a higher likelihood of being successfully decoded, the ECC system provides an uncorrected copy of Page 4 440 to the LDPC decoder 490. The ECC system also provides a first soft bit (represented as soft bit page 480 or SB1) to the LDPC decoder 490. As previously explained, the soft bit page 480 is a natural soft bit page read from the memory of (or a soft bit representation of) Page 4 400. The ECC system also provides a second soft bit page (SB2) to the LDPC decoder 490. In an example, the second soft bit page is a XOR representation of Page 4 470.

If the LDPC successfully decodes and/or corrects Page 4 440, the process is repeated with Page 2 420. However, in some examples, if Page 4 440 was not successfully decoded, the ECC system will not attempt to decode and/or correct Page 2 420. In other examples, even if Page 4 440 was not corrected, the ECC system will attempt to decode and/or correct Page 2 420. However, in such an example, the ECC system will not try to decode Page 4 440 a second time. For example, the ECC system implements a "one shot" joint decoding scheme in which the ECC system attempts to decode each failed page a single time.

Figure 5:
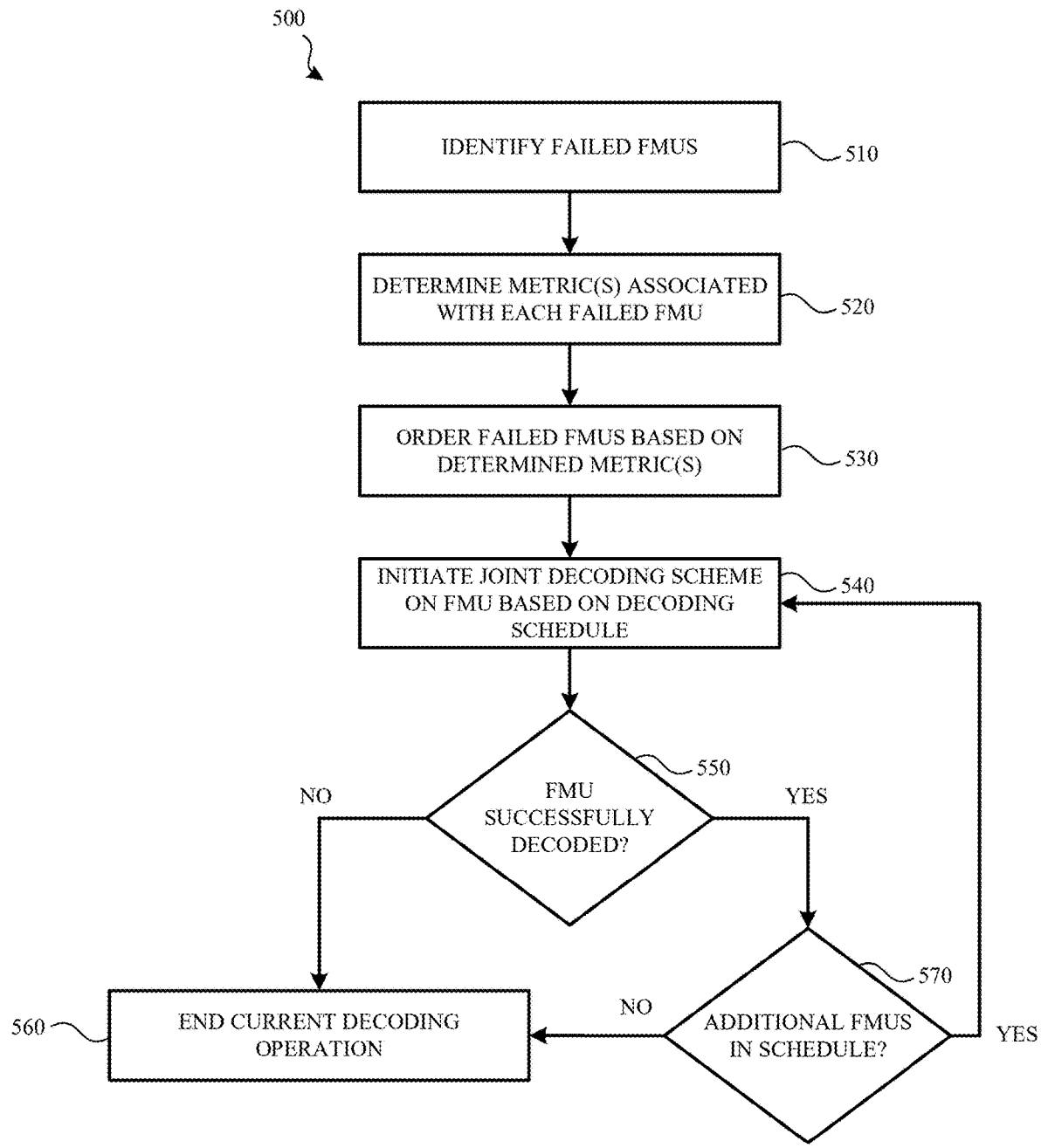
FIG. 5 illustrates a method of executing a joint decoding scheme on two or more FMUs of a stripe according to an example.

FIG. 5 illustrates a method 500 of executing a joint decoding scheme on two or more FMUs of a stripe according to an example. In an example, the method 500 is executed by an ECC system and/or an ECC ordering system of a data storage device. For example, the method 500 is executed by the ECC system 185 and/or the ECC ordering system 180 shown and described with respect to FIG. 1. Additionally, in an example, the method 500 is executed on the pages of the stripe 400 shown and described with respect to FIG. 4A.

The method 500 begins when the ECC system identifies (510) two or more FMUs in a stripe that have failed an initial decoding process. For example, the ECC system identifies two or more FMUs that have failed an initial decoding process executed by a first decoding scheme (e.g., an LDPC decoding scheme). In another example, the ECC system identifies two or more FMUs that have a BER over a threshold or have otherwise been identified as including errors and/or being uncorrectable.

Based, at least in part, on identifying two or more failed FMUs, the ECC system determines (520) one or more metrics associated with each failed FMU. In an example, the one or more metrics indicate a syndrome weight or a BER associated with each failed FMU. In another example, the one or more metrics indicate a combined BER associated with each failed FMU. In an example, the combined BER is determined using the various operations described herein.

When the one or more metrics associated with each failed FMU have been determined, the ECC system generates a decoding schedule or otherwise orders (530) the failed FMUs based on the determine metric(s). In an example, the one or more metrics associated with each failed FMU indicate a likelihood or a probability that the failed FMU will be successfully decoded during a joint decoding scheme. As previously discussed, in an example, the joint decoding scheme utilizes a first decoding scheme (e.g., a LDPC decoding scheme) and a second decoding scheme (e.g., a RAID or XOR decoding scheme).

The ECC system also initiates (540) the joint decoding scheme on the failed FMUs based on the determined decoding schedule. For example, if the one or more metrics indicate that a first FMU is more likely to be successfully decoded using the joint decoding scheme when compared with a second FMU, the ECC system causes the joint decoding scheme to be executed on the first FMU.

When the joint decoding scheme has been executed on the failed FMU, the ECC system determines (550) whether the FMU was decoded successfully. If the ECC system determines the FMU was not successfully decoded, the ECC system causes the current decoding operation to end (560). For example, because the failed FMUs are ordered from the most likely to be decoded to the least likely to be decoded, once the joint decoding scheme has failed to decode a failed FMU, there is no need to continue attempting to decode other failed FMUs because they have a lower likelihood of being decoded. However, in other examples, even if a FMU is not successfully decoded, the method 500 will be repeated on other failed FMUs.

However, if the ECC system determines (550) that the FMU was decoded successfully, the ECC system also determines (570) whether the decoding schedule contains additional FMUs that have failed the initial decoding process. If the ECC system determines that there are other FMUs in the schedule that need to be decoded, the ECC system initiates (540) the joint decoding scheme on the next FMU in the schedule and the process repeats. In an example, the newly decoded FMU is usable in the subsequent joint decoding operation(s).

However, if the ECC system determines (570) that there are no more failed FMUs in the decoding schedule, the ECC system causes the current decoding operation to end (560).

Figure 6:
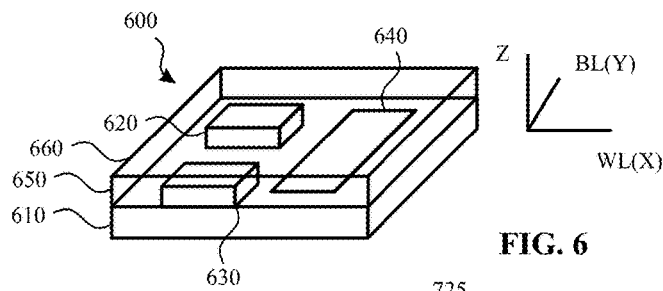
FIG. 6 is a perspective view of a storage device that includes three-dimensional (3D) stacked non-volatile memory according to an example.
Figure 7:
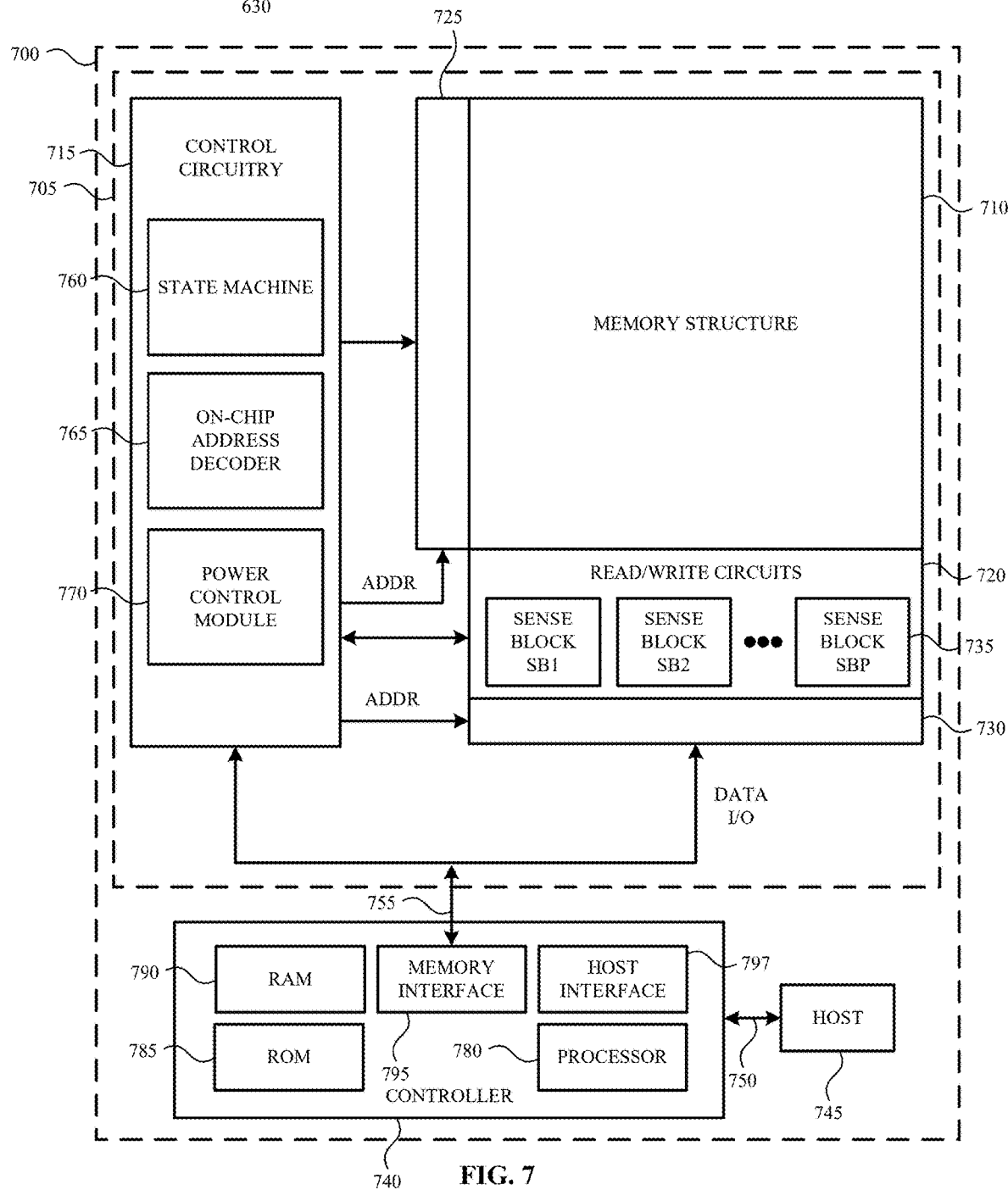
FIG. 7 is a block diagram of a storage device according to an example.

FIG. 6-FIG. 7 describe example storage devices that may be used with or otherwise implement the various features described herein. For example, the storage devices shown and described with respect to FIG. 6-FIG. 7 may include various systems and components that are similar to the systems and components shown and described with respect to FIG. 1. For example, the controller 740 shown and described with respect to FIG. 7 may be similar to the controller 150 of FIG. 1. Likewise, the memory dies 705 may be similar to the first memory die 165 and/or the second memory die 170 of FIG. 1.

FIG. 6 is a perspective view of a storage device 600 that includes three-dimensional (3D) stacked non-volatile memory according to an example. In this example, the storage device 600 includes a substrate 610. Blocks of memory cells are included on or above the substrate 610. The blocks include a first block (BLK0 620) and a second block (BLK1 630). Each block is formed of memory cells (e.g., non-volatile memory elements). The substrate 610 also includes a peripheral area 640 having support circuits that are used by the first block and the second block.

The substrate 610 also carries circuits under the blocks, along with one or more lower metal layers which are patterned in conductive paths to carry signals from the circuits. In an example, the blocks are formed in an intermediate region 650 of the storage device 600. The storage device also includes an upper region 660. The upper region 660 includes one or more upper metal layers that are patterned in conductive paths to carry signals from the circuits. Each block of memory cells includes a stacked area of memory cells. In an example, alternating levels of the stack represent word lines. While two blocks are depicted, additional blocks may be used and extend in the x-direction and/or the y-direction.

In an example, a length of a plane of the substrate 610 in the x-direction represents a direction in which signal paths for word lines or control gate lines extend (e.g., a word line or drain-end select gate (SGD) line direction) and the width of the plane of the substrate 610 in the y-direction represents a direction in which signal paths for bit lines extend (e.g., a bit line direction). The z-direction represents a height of the storage device 600.

FIG. 7 is a functional block diagram of a storage device 700 according to an example. In an example, the storage device 700 is similar to the 3D stacked non-volatile storage device 600 shown and described with respect to FIG. 6. In an example, the components depicted in FIG. 7 are electrical circuits. In an example, the storage device 700 includes one or more memory dies 705. Each memory die 705 includes a three-dimensional memory structure 710 of memory cells (e.g., a 3D array of memory cells), control circuitry 715, and read/write circuits 720. In another example, a two-dimensional array of memory cells may be used. The memory structure 710 is addressable by word lines using a first decoder 725 (e.g., a row decoder) and by bit lines using a second decoder 730 (e.g., a column decoder). The read/write circuits 720 may also include multiple sense blocks 735 including SB1, SB2, . . . , SBp (e.g., sensing circuitry) which allow pages of the memory cells to be read or programmed in parallel. The sense blocks 735 may include bit line drivers.

In an example, a controller 740 is included in the same storage device 700 as the one or more memory dies 705. In another example, the controller 740 is formed on a die that is bonded to a memory die 705, in which case each memory die 705 may have its own controller 740. In yet another example, a controller die controls all of the memory dies 705. Although a single controller 740 is shown, the storage device 700 can include multiple controllers with each controller responsible for different operations described herein.

Commands and data are transferred between a host 745 and the controller 740 using a data bus 750. Additionally, commands and data are transferred between the controller 740 and one or more of the memory dies 705 by way of lines 755. In one example, the memory die 705 includes a set of input and/or output (I/O) pins that connect to lines 755.

The memory structure 710 also includes one or more arrays of memory cells. The memory cells are arranged in a three-dimensional array or a two-dimensional array. The memory structure 710 includes any type of non-volatile memory that is formed on one or more physical levels of arrays of memory cells having an active area disposed above a silicon substrate. The memory structure 710 may be in a non-volatile memory device having circuitry associated with the operation of the memory cells, whether the associated circuitry is above or within the substrate.

The control circuitry 715 works in conjunction with the read/write circuits 720 to perform memory operations (e.g., erase, program, read, and others) on the memory structure 710. The control circuitry 715 may include registers, ROM fuses, and other devices for storing default values such as base voltages and other parameters.

The control circuitry 715 also includes a state machine 760, an on-chip address decoder 765 and a power control module. The state machine 760 provides chip-level control of various memory operations, such as selecting a memory block for programming. The state machine 760 is programmable by software. In another example, the state machine 760 does not use software and is completely implemented in hardware (e.g., electrical circuits).

The on-chip address decoder 765 provides an address interface between addresses used by host 745 and/or the controller 740 to a hardware address used by the first decoder 725 and the second decoder 730. The power control module 770 controls power and voltages that are supplied to the word lines and bit lines during memory operations. The power control module 770 may include drivers for word line layers in a 3D configuration, select transistors (e.g., SGS and SGD transistors) and source lines. The power control module 770 may include one or more charge pumps for creating voltages.

The control circuitry 715, the state machine 760, the on-chip address decoder 765, the first decoder 725, the second decoder 730, the power control module 770, the sense blocks 735, the read/write circuits 720, and/or the controller 740 may be considered one or more control circuits and/or a managing circuit that perform some or all of the operations described herein.

In an example, the controller 740, is an electrical circuit that may be on-chip or off-chip. Additionally, the controller 740 may include one or more processors 780, ROM 785, RAM 790, memory interface 795, and host interface 797, all of which may be interconnected. In an example, the one or more processors 780 is one example of a control circuit. Other examples can use state machines or other custom circuits designed to perform one or more functions. Devices such as ROM 785 and RAM 790 may include code such as a set of instructions. One or more of the processors 780 may be operable to execute the set of instructions to provide some or all of the functionality described herein.

Alternatively or additionally, one or more of the processors 780 may access code from a memory device in the memory structure 710, such as a reserved area of memory cells connected to one or more word lines. The memory interface 795, in communication with ROM 785, RAM 790, and one or more of the processors 780, may be an electrical circuit that provides an electrical interface between the controller 740 and the memory die 705. For example, the memory interface 795 may change the format or timing of signals, provide a buffer, isolate from surges, latch I/O, and so forth.

The one or more processors 780 may issue commands to control circuitry 715, or any other component of memory die 705, using the memory interface 795. The host interface 797, in communication with the ROM 785, the RAM 790, and the one or more processors 780, may be an electrical circuit that provides an electrical interface between the controller 740 and the host 745. For example, the host interface 797 may change the format or timing of signals, provide a buffer, isolate from surges, latch I/O, and so on. Commands and data from the host 745 are received by the controller 740 by way of the host interface 797. Data sent to the host 745 may be transmitted using the data bus 750.

Multiple memory elements in the memory structure 710 may be configured so that they are connected in series or so that each element is individually accessible. By way of a non-limiting example, flash memory devices in a NAND configuration (e.g., NAND flash memory) typically contain memory elements connected in series. A NAND string is an example of a set of series-connected memory cells and select gate transistors.

A NAND flash memory array may also be configured so that the array includes multiple NAND strings. In an example, a NAND string includes multiple memory cells sharing a single bit line and are accessed as a group. Alternatively, memory elements may be configured so that each memory element is individually accessible (e.g., a NOR memory array). The NAND and NOR memory configurations are examples and memory cells may have other configurations.

The memory cells may be arranged in the single memory device level in an ordered array, such as in a plurality of rows and/or columns. However, the memory elements may be arrayed in non-regular or non-orthogonal configurations, or in structures not considered arrays.

In an example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, such as in the y direction) with each column having multiple memory cells. The vertical columns may be arranged in a two-dimensional arrangement of memory cells, with memory cells on multiple vertically stacked memory planes. Other configurations of memory elements in three dimensions can also constitute a 3D memory array.

In another example, in a 3D NAND memory array, the memory elements may be coupled together to form vertical NAND strings that traverse across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Based on the above, examples of the present disclosure describe a method, comprising: identifying two or more flash memory units (FMUs) associated with a data storage device that have failed an initial decoding operation executed by an error code correction system of the data storage device; determining a metric associated with each of the two or more FMUs; generating a decoding schedule for the two or more FMUs based, at least in part, on the metric associated with each of the two or more FMUs; and executing a joint decoding operation on a first FMU of the two or more FMUs based on the generated decoding schedule using a joint decoding scheme, the joint decoding scheme comprising a first decoding scheme and a second decoding scheme. In an example, the first decoding scheme is a low-density parity check (LDPC) decoding scheme. In an example, the second decoding scheme is a redundant array of independent dies (RAID) decoding scheme. In an example, the method also includes determining whether the joint decoding operation on the first FMU of the two or more FMUs was successful; and based, at least in part, on determining the joint decoding operation on the first FMU of the two or more FMUs was successful, executing the joint decoding operation on a second FMU of the two or more FMUs. In an example, the method also includes determining whether the joint decoding operation on the first FMU of the two or more FMUs was successful; and based, at least in part, on determining the joint decoding operation on the first FMU of the two or more FMUs was unsuccessful, ending the joint decoding operation. In an example, the metric is a syndrome weight associated with each FMU of the two or more FMUs. In an example, the metric is a combined bit error rate (BER) associated with each FMU of the two or more FMUs. In an example, each FMU of the two or more FMUs is associated with a stripe.

Other examples describe a data storage device, comprising: a controller; and an error correction code (ECC) system associated with the controller and operable to: execute an initial decoding operation on flash memory units (FMUs) associated with a stripe; determine whether any FMUs failed the initial decoding operation; and based, at least in part, on determining two or more FMUs failed the initial decoding operation: determine a metric associated with each of the two or more FMUs; determine, based at least in part, on the metric associated with each of the two or more FMUs, an order in which each of the two or more FMUs will undergo a joint decoding operation using a joint decoding scheme, the joint decoding scheme comprising a first decoding scheme and a second decoding scheme; and execute the joint decoding operation on the two or more FMUs in the determined order. In an example, the ECC system is further operable to: determine whether the joint decoding operation on a first FMU of the two or more FMUs was successful; and based, at least in part, on a determination that the joint decoding operation on the first FMU of the two or more FMUs was successful, executing the joint decoding operation on a second FMU of the two or more FMUs. In an example, the ECC system is further operable to: determine whether the joint decoding operation on a first FMU of the two or more FMUs was successful; and based, at least in part, on a determination that the joint decoding operation on the first FMU of the two or more FMUs was unsuccessful, ending the joint decoding operation. In an example, the first decoding scheme is a low-density parity check (LDPC) decoding scheme. In an example, the second decoding scheme is a redundant array of independent dies (RAID) decoding scheme. In an example, the metric is a syndrome weight associated with each FMU of the two or more FMUs. In an example, the metric is a combined bit error rate (BER) associated with each FMU of the two or more FMUs.

Examples also describe a data storage device, comprising: a control means; and an error correction means associated with the control means and operable to: determine whether two or more memory means associated with the data storage device have failed an initial decoding operation; based, at least in part, on a determination that two or more memory means have failed the initial decoding operation: determine a first metric associated with a first memory means of the two or more memory means; determine a second metric associated with a second memory means of the two or more memory means; compare the first metric and the second metric; generate a decoding schedule based, at least in part, on comparing the first metric and the second metric; and execute a joint decoding operation using a joint decoding scheme on at least one of the first memory means and the second memory means based, at least in part, on the decoding schedule, the joint decoding scheme comprising a first decoding scheme and a second decoding scheme. In an example, the error correction means is further operable to: determine whether the joint decoding operation on the at least one of the first memory means and the second memory means was successful; and based, at least in part, on a determination that the joint decoding operation on the at least one of the first memory means and the second memory means was successful, executing the joint decoding operation on another memory means. In an example, the error correction means is further operable to: determine whether the joint decoding operation on the at least one of the first memory means and the second memory means was successful; and based, at least in part, on a determination that the joint decoding operation on the at least one of the first memory means and the second memory means was unsuccessful, ending the joint decoding operation. In an example, the first decoding scheme is a low-density parity check (LDPC) decoding scheme and the second decoding scheme is a redundant array of independent dies (RAID) decoding scheme. In an example, the metric is a combined bit error rate (BER) associated with each of the two or more failed memory means.

One of ordinary skill in the art will recognize that the technology described herein is not limited to a single specific memory structure, but covers many relevant memory structures within the spirit and scope of the technology as described herein and as understood by one of ordinary skill in the art.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present disclosure, one skilled in the art may envision variations, modifications, and alternate aspects falling within the spirit of the broader aspects of the general inventive concept embodied in this disclosure that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A method, comprising:
identifying two or more flash memory units (FMUs) associated with a data storage device that have failed an initial decoding operation executed by an error code correction system of the data storage device;
determining a metric associated with each of the two or more FMUs;
generating a decoding schedule for the two or more FMUs based, at least in part, on the metric associated with each of the two or more FMUs, the decoding schedule indicating an order in which the two or more FMUs will be decoded using a joint decoding scheme, the joint decoding scheme comprising a first decoding scheme and a second decoding scheme;
executing a joint decoding operation on a first FMU of the two or more FMUs in the order specified by the generated decoding schedule and using the joint decoding scheme; and
determining whether the joint decoding operation on the first FMU of the two or more FMUs is successful.

2. The method of claim 1, wherein the first decoding scheme is a low-density parity check (LDPC) decoding scheme.

3. The method of claim 1, wherein the second decoding scheme is a redundant array of independent dies (RAID) decoding scheme.

4. The method of claim 1, further comprising executing the joint decoding operation on a second FMU of the two or more FMUs based, at least in part, on determining the joint decoding operation on the first FMU of the two or more FMUs was successful.

5. The method of claim 1, further comprising ending the joint decoding operation based, at least in part, on determining the joint decoding operation on the first FMU of the two or more FMUs was unsuccessful.

6. The method of claim 1, wherein the metric is a syndrome weight associated with each FMU of the two or more FMUs.

7. The method of claim 1, wherein the metric is a combined bit error rate (BER) associated with each FMU of the two or more FMUs.

8. The method of claim 1, wherein each FMU of the two or more FMUs is associated with a stripe.

9. A data storage device, comprising:
a controller; and
an error correction code (ECC) system associated with the controller and operable to:
  execute an initial decoding operation on flash memory units (FMUs) associated with a stripe;
  determine whether any FMUs failed the initial decoding operation; and
  based, at least in part, on determining two or more FMUs failed the initial decoding operation:
    determine a metric associated with each of the two or more FMUs;
    determine, based at least in part, on the metric associated with each of the two or more FMUs, an order in which each of the two or more FMUs will undergo a joint decoding operation using a joint decoding scheme, the joint decoding scheme comprising a first decoding scheme and a second decoding scheme;
    execute the joint decoding operation on the two or more FMUs in the determined order; and
    determine whether the joint decoding operation on a first FMU of the two or more FMUs is successful.

10. The data storage device of claim 9, wherein the ECC system is further operable to execute the joint decoding operation on a second FMU of the two or more FMUs based, at least in part, on a determination that the joint decoding operation on the first FMU of the two or more FMUs is successful.

11. The data storage device of claim 9, wherein the ECC system is further operable to end the joint decoding operation based, at least in part, on a determination that the joint decoding operation on the first FMU of the two or more FMUs was unsuccessful.

12. The data storage device of claim 9, wherein the first decoding scheme is a low-density parity check (LDPC) decoding scheme.

13. The data storage device of claim 9, wherein the second decoding scheme is a redundant array of independent dies (RAID) decoding scheme.

14. The data storage device of claim 9, wherein the metric is a syndrome weight associated with each FMU of the two or more FMUs.

15. The data storage device of claim 9, wherein the metric is a combined bit error rate (BER) associated with each FMU of the two or more FMUs.

16. A data storage device, comprising:
a control means; and
an error correction means associated with the control means and operable to:
  determine whether two or more memory means associated with the data storage device failed an initial decoding operation;
  based, at least in part, on a determination that two or more memory means failed the initial decoding operation:
    determine a first metric associated with a first memory means of the two or more memory means;
    determine a second metric associated with a second memory means of the two or more memory means;
    compare the first metric and the second metric;
    generate a decoding schedule based, at least in part, on comparing the first metric and the second metric;
    execute a joint decoding operation using a joint decoding scheme on at least one of the first memory means and the second memory means using the decoding schedule, the joint decoding scheme comprising a first decoding scheme and a second decoding scheme; and
    determine whether the joint decoding operation on the at least one of the first memory means and the second memory means is successful.

17. The data storage device of claim 16, wherein the error correction means is further operable to execute the joint decoding operation on another memory means based, at least in part, on a determination that the joint decoding operation on the at least one of the first memory means and the second memory means was successful.

18. The data storage device of claim 16, wherein the error correction means is further operable to end the joint decoding operation based, at least in part, on a determination that the joint decoding operation on the at least one of the first memory means and the second memory means was unsuccessful.

19. The data storage device of claim 16, wherein the first decoding scheme is a low-density parity check (LDPC) decoding scheme and the second decoding scheme is a redundant array of independent dies (RAID) decoding scheme.

20. The data storage device of claim 16, wherein the metric is a combined bit error rate (BER) associated with each of the two or more failed memory means.

* * * * *